United States Patent [19]
Tani et al.

[11] Patent Number: 5,468,979
[45] Date of Patent: Nov. 21, 1995

[54] SEMICONDUCTOR DEVICE HAVING TRENCH TYPE CAPACITORS FORMED COMPLETELY WITHIN AN INSULATING LAYER

[75] Inventors: Tomofune Tani, Sagamihara; Ichiro Murai; Kenji Anzai, both of Tokyo, all of Japan

[73] Assignee: Nippon Steel Corporation, Tokyo, Japan

[21] Appl. No.: 294,787

[22] Filed: Aug. 23, 1994

Related U.S. Application Data

[63] Continuation of Ser. No. 54,067, Apr. 29, 1993, abandoned.

[30] Foreign Application Priority Data

Apr. 30, 1992 [JP] Japan ..................... 4-138006

[51] Int. Cl.⁶ .......................... H01L 29/68; H01L 29/78; H01L 29/92
[52] U.S. Cl. .................. 257/304; 257/71; 257/301; 257/347
[58] Field of Search ................. 257/71, 347, 301–305

[56] References Cited

U.S. PATENT DOCUMENTS

| 4,536,785 | 8/1985 | Gibbons | 257/71 |
| 5,233,207 | 8/1993 | Anzai | 257/71 |

FOREIGN PATENT DOCUMENTS

| 4038114 | 6/1991 | Germany | 257/304 |
| 61-199657 | 9/1986 | Japan | 257/304 |
| 62-211946 | 9/1987 | Japan | 257/301 |
| 1-119054 | 5/1989 | Japan . | |
| 3296265 | 12/1991 | Japan | 257/301 |

Primary Examiner—Jerome Jackson
Assistant Examiner—John Guay
Attorney, Agent, or Firm—Pollock, Vande Sande & Priddy

[57] ABSTRACT

A semiconductor device including a silicon substrate, an insulator film formed on said substrate, a transistor provided on said insulator film and a capacitor formed in a trench formed in said insulator film, and a method of manufacturing the same.

12 Claims, 5 Drawing Sheets

SEMICONDUCTOR DEVICE HAVING TRENCH TYPE CAPACITORS FORMED COMPLETELY WITHIN AN INSULATING LAYER

This application is a continuation of Ser. No. 08/054,067, filed on Apr. 29, 1993, now abandoned.

BACKGROUND OF THE INVENTION

1. Field of the Invention

The present invention relates to a semiconductor device, and more particularly to a semiconductor device such as a DRAM and a method of manufacturing the same.

2. Description of the Related Art

A conventional DRAM memory cell having one transistor and one capacitor will be described with reference to FIG. 10.

In manufacturing a conventional DRAM memory cell, a field insulator film 305 is formed first on a silicon substrate 301 by a localized oxidation of silicon (LOCOS) method, and then ion implantation of impurities for threshold voltage regulation is performed into the silicon substrate 301 by using the field insulator film 305 as a mask. Next, a polysilicon film is formed by a chemical vapor deposition (CVD) method and ion implantation of impurities for resistance reduction is performed, and thereafter patterning is applied thereto by etching so as to form a gate electrode 302.

Next, ion implantation of impurities is performed in the silicon substrate 301 by using the gate electrode 302 and the field insulator film 305 as a mask thereby forming a source region 303 and a drain region 304.

Next, a polysilicon film 307, a capacitor insulator film 308 and a polysilicon film 309 are successively formed by CVD method, thermal oxidation and CVD, respectively, thereby to form a stack capacitor. Thereafter, an interlayer insulator film 310 is formed by undoped silicade glass (NSG) or boron phosphorus silicade glass (BPSG) and a contact hole is formed to reach the drain region 304. Thereafter a metallic interconnection 311 such as aluminum is formed thereby to form a DRAM memory cell. Besides, 303 represents a semiconductor region, and 306 represents a gate insulator film. Such a DRAM memory cell has been disclosed in JP-A-1-119054 for instance.

Conventionally, an occupied area per DRAM cell is determined by a distance between the field insulator film 305 and the gate and a gate length, and these lengths have limits for reduction. Thus, the occupied area per cell has its limit for reduction. As a result, it has been difficult to achieve integration of memory cells in high density. Further, it involves a problem that a leak current is produced from a transistor forming the DRAM cell.

SUMMARY OF THE INVENTION

It is an object of the present invention to provide a semiconductor device including at least one memory cell having a transistor and a capacitor in which the occupied area of each memory cell is reduced so that it is possible to integrate memory cells at a high density in the semiconductor device and also it is capable of suppressing the leak current of the transistor and a method of manufacturing the same.

In order to achieve the above object, a semiconductor device of the present invention includes a silicon substrate, an insulating film formed on the substrate, a transistor provided on the insulating film and a capacitor formed in a trench provided in the insulating film.

According to one aspect of the invention, a semiconductor device including at least one transistor and one capacitor comprises: a silicon substrate; a base insulating film formed on the silicon substrate; a gate electrode of the transistor formed on the base insulating film; a gate insulating film formed so as to cover the gate electrode; a semiconductor film formed on the gate insulating film and including first and second regions spaced from each other and having a first conductivity type to provide source and drain regions of the transistor and a third region disposed between said first and second regions and having a second conductivity type different from said first conductivity type to provide a channel region of the transistor; a trench formed in the base insulating film; and the capacitor formed in the trench and including a first semiconductor layer, an interlayer insulating layer and a second semiconductor layer laminated in that order, wherein the first semiconductor layer is formed integrally with the first region of the transistor.

Further, a method of manufacturing a semiconductor device including at least one transistor and one capacitor according to the present invention comprises the steps of: forming a base insulating film on a silicon substrate; forming a gate electrode on the base insulating film; forming a gate insulating film covering the gate electrode; forming a trench in the base insulating film; forming a semiconductor film to extend on the gate electrode and in the trench; ion-implanting impurities selectively in the semiconductor film thereby making source, drain and channel regions of the transistor extending on the gate electrode and an electrode plate of the capacitor extending in the trench; and laminating successively an insulating layer and a conductive layer on the electrode plate formed in the trench so as to constitute the conductive layer by the conductive layer and the insulating layer together with the electrode plate in the trench.

According to the present invention structured as described above, the transistor in the DRAM memory cell is a vertical transistor having an SOI structure. Therefore, the occupied area of one cell can be made smaller as compared with a conventional transistor of a planar structure, thus making it possible to make correspondingly the area of the DRAM memory cell smaller. Further, since the capacitor is buried in a trench formed in the base insulating film, it is possible to make its occupied area smaller as compared with a conventional stack capacitor so that the memory cells can be integrated in the DRAM at a high density.

In addition, since this transistor has a silicon on insulator (SOI) structure, it is possible to suppress a leak current of the transistor, and since the operating speed of the transistor is increased, the DRAM can be operated at high speed with high stability.

DESCRIPTION OF THE PREFERRED EMBODIMENTS

An embodiment of the present invention will be described hereinafter with reference to the drawings.

FIG. 1 to FIG. 7 show a method of manufacturing a DRAM cell using a vertical transistor according to an embodiment of the present invention.

Figure 1:
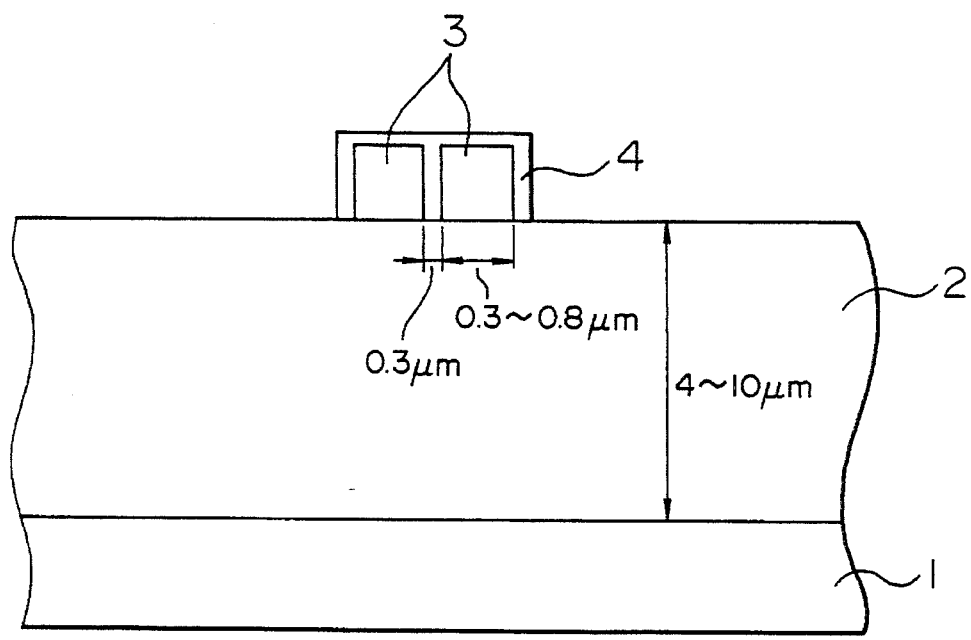
FIGS. 1–7 are diagrams for explaining respective steps of a method of manufacturing a semiconductor device according to an embodiment of the present invention.

First, a base insulating film 2 is formed on a silicon substrate 1 as shown in FIG. 1. Here, the conduction type of the silicon substrate 1 may be either a p-type or an n-type. Further, the insulating film 2 is a silicon dioxide film having a film thickness of approximately 4 to 10 μm formed by thermal oxidation or CVD.

Next, a polysilicon film having a film thickness of approximately 0.3 to 1.0 μm for instance is formed on the whole surface of the silicon substrate 1, impurity such as phosphorus, arsenic and boron are implanted at a dose to produce concentration of approximately $10^{20}/cm^3$ so as to reduce the resistance of the polysilicon film, and furthermore, patterning is made by etching so as to form gate electrodes 3. Besides, it is also possible to form the gate electrodes 3 by a polycide film (a composite film obtained by laminating a refractory metal silicide film on a polysilicon film doped with impurities) for instance. The width of the gate 3 is 0.3 to 0.8 μm, and the gap between the gates is approximately 0.3 μm.

Next, a silicon dioxide film having a film thickness of approximately 10 to 50 nm is formed on the whole surface of a substrate unit on which the gate electrodes 3 have been formed by a CVD method, and patterning is made by etching so as to form a gate insulating film 4. Here, the term "substrate unit" is used to indicate a whole unit including the substrate 1 and variety of films or layers which have already been formed on the substrate 1.

Figure 2:
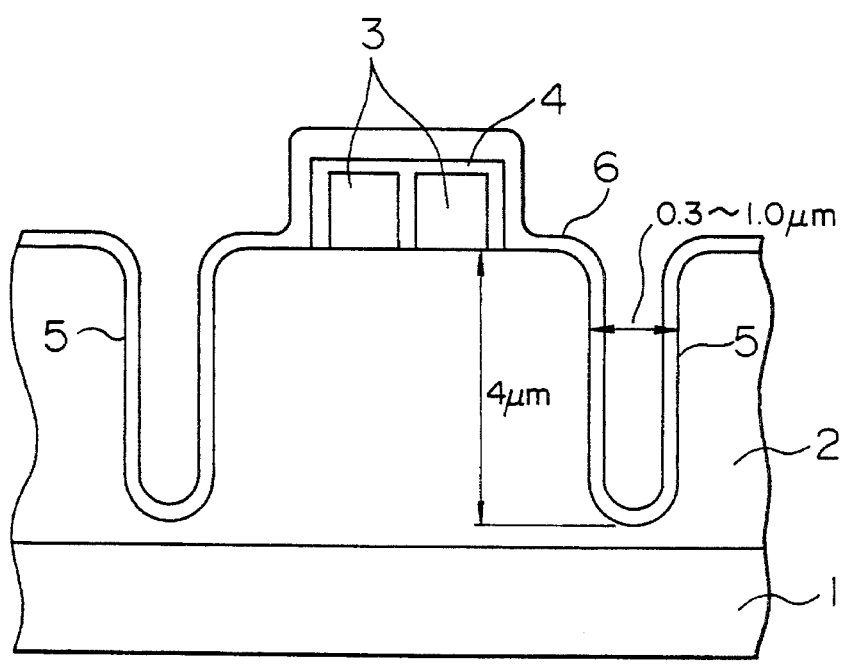

Next, trenches 5 for capacitors are formed by reactive ion etching (RIE) in the insulating film 2 in parallel with the gate electrode 3 as shown in FIG. 2, each trench having a width of 0.3 to 1.0 μm and a depth of about 4 μm. Thereafter, a polysilicon film 6 having a film thickness of approximately 0.1 to 0.3 μm is formed on the whole surface of the substrate unit.

Figure 3:
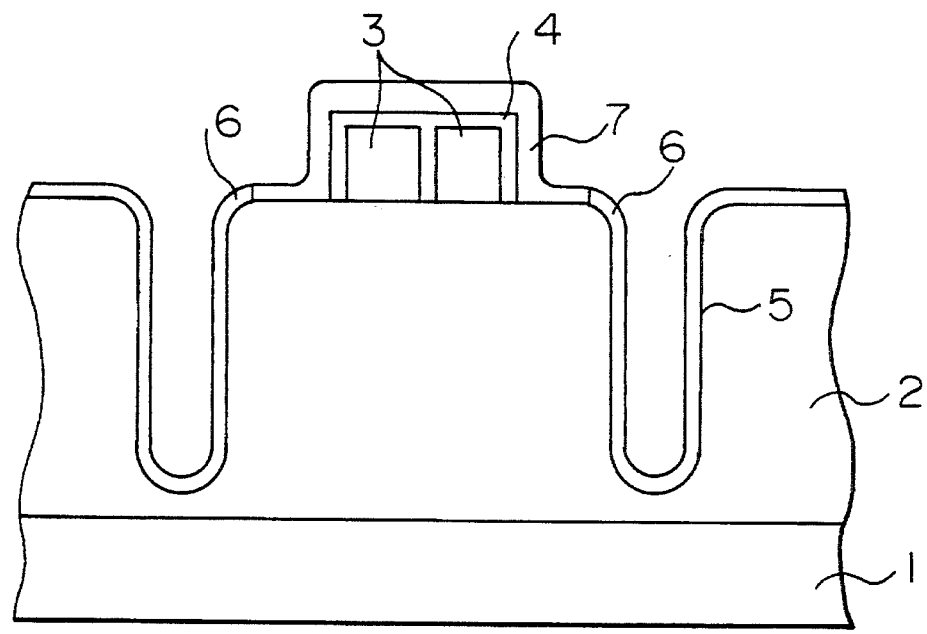

Next, a portion of the polysilicon film 6 covering the insulating film 2 and the insulating film 4 disposed between the two trenches 5 is recrystallized by using laser beam irradiation, thereby to form a single crystal silicon film 7 as shown in FIG. 3. This single crystal silicon film 7 provides a channel region of the transistor.

Figure 4:
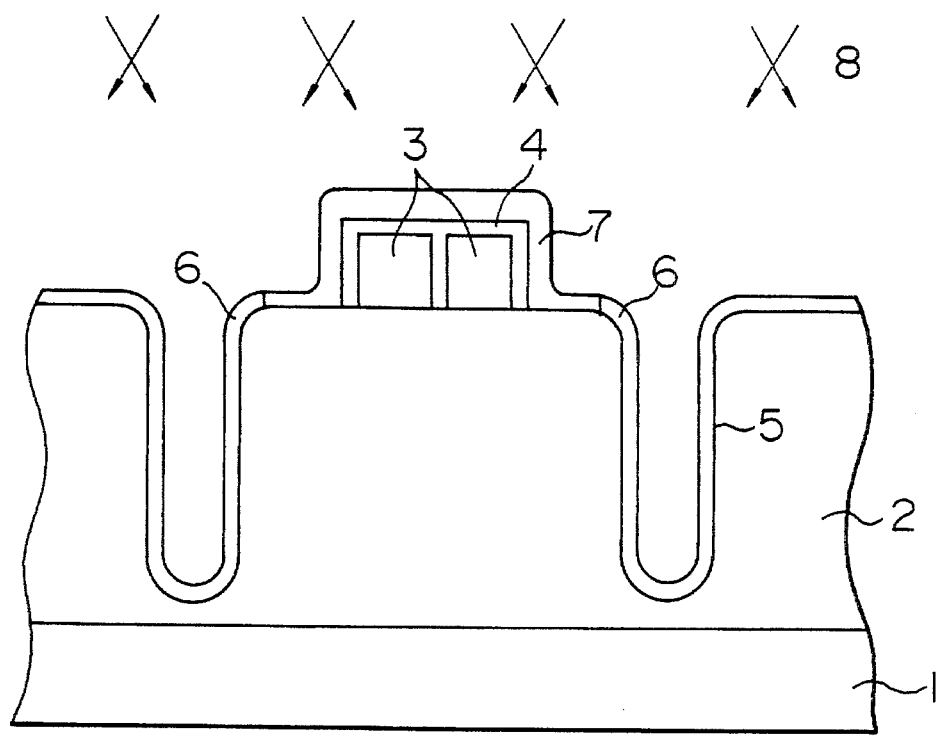

Next, as shown by arrow marks 8 in FIG. 4, in order to determine the conduction type and the impurity density of the channel region, N-type impurities such as phosphorus and arsenic or P-type impurities such as boron are ion-implanted at a low density into the whole surface of the polysilicon film 6 and the single crystal silicon film 7. At this time, since vertical faces are formed at portions of the silicon film 7 corresponding to the side walls of the gate electrodes 3, the ion implantation is performed in a direction tilted by approximately 60° maximum with respect to the direction perpendicular to the substrate surface so that the impurity ions are implanted into the vertical faces. The dose of the ion implantation is approximately $1\times10^{11}$ to $1\times10^{13}/cm^2$.

Figure 5:
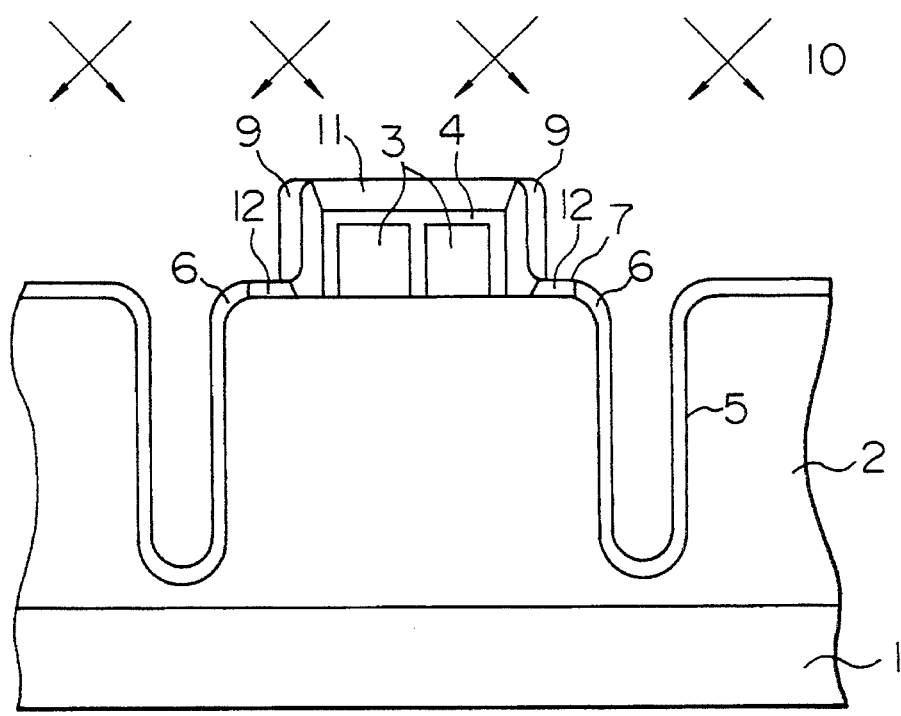

Next, a silicon dioxide film having a film thickness of approximately 0.2 to 1.0 μm is formed on the whole surface of the substrate unit by a CVD method, and anisotropic etching is applied to the silicon dioxide film in a direction perpendicular to the substrate surface by a reactive ion etching (RIE) method for instance, thereby to form insulating films 9 as shown in FIG. 5.

Next, by using the insulating films 9 as a mask, impurities having a conduction type different from the conduction type of the channel region are ion-implanted at a dose of approximately $1\times10^6/cm^2$ from a direction tilted by approximately 60° maximum with respect to the substrate unit surface as shown by arrows 10, thereby to form semiconductor regions 11 and 12 as shown in FIG. 5. These semiconductor regions 11 and 12 provide a source region or a drain region, thus forming vertical MOS transistors having the gate electrodes 3.

Next, the insulating films 9 are removed by etching.

Figure 6:
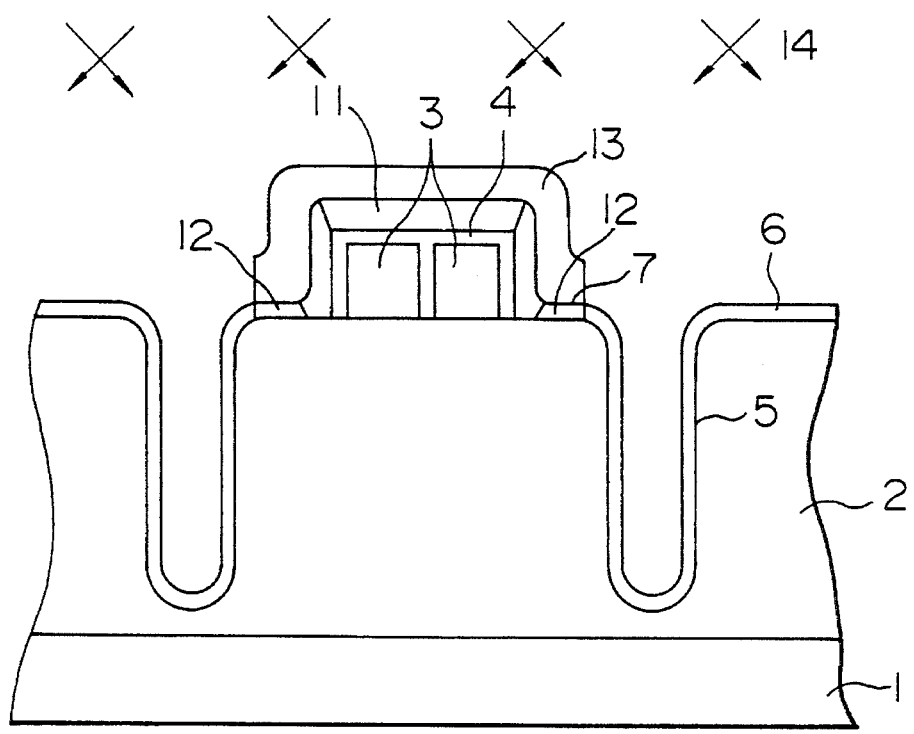

Next, a silicon dioxide film having a film thickness of approximately 50 to 500 nm is formed by a CVD method. Thereafter, patterning is applied to this silicon dioxide film by etching, thereby to form an insulating film 13 as shown in FIG. 6.

Next, in order to reduce the resistance of the polysilicon films 6, impurities having the same conduction type as that of the source region 12 are ion-implanted at a dose to produce concentration of approximately $10^{20}/cm^3$ as shown by arrows 14 by using the insulating film 13 as a mask. In this case, ion implantation 14 is performed at a maximum angle of 60° tilted with respect to the face perpendicular to the substrate unit surface so that impurities are implanted in the vertical side wall portions of the trenches 5.

Figure 7:
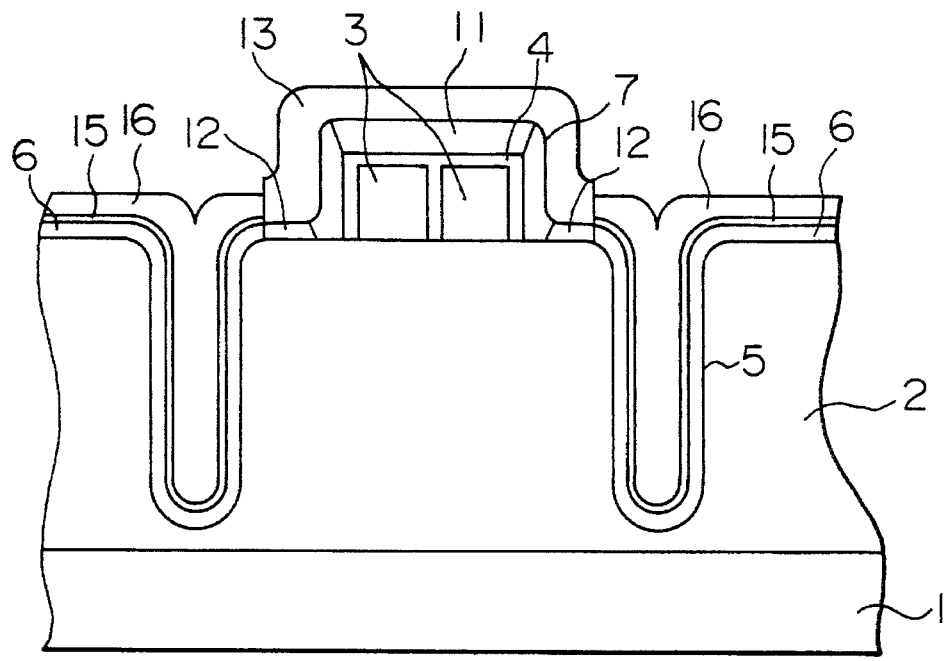

Next, capacitor insulating films 15 are formed by thermal oxidation as shown in FIG. 7.

Next, a polysilicon film is formed on the whole surface of the substrate unit by a CVD method and impurities having the same conduction type as that of impurities implanted in the polysilicon films 6 are ion-implanted at a dose to produce concentration of approximately $10^{20}/cm^3$. Thereafter, patterning is made by etching, so as to form polysilicon films 16. Here, a buried type stack capacitor is formed in each trench by the polysilicon films 6 and 16 and the capacitor insulating film 15.

Thereafter, patterning is applied to the polysilicon film 6, the capacitor insulating film 15 and the polysilicon film 16 by etching, and an insulating film 17 is formed further as an interlayer insulating film. This insulating film 17 is a lamination of a silicon dioxide film made by a CVD method and an SOG or BPSG film.

Figure 8:
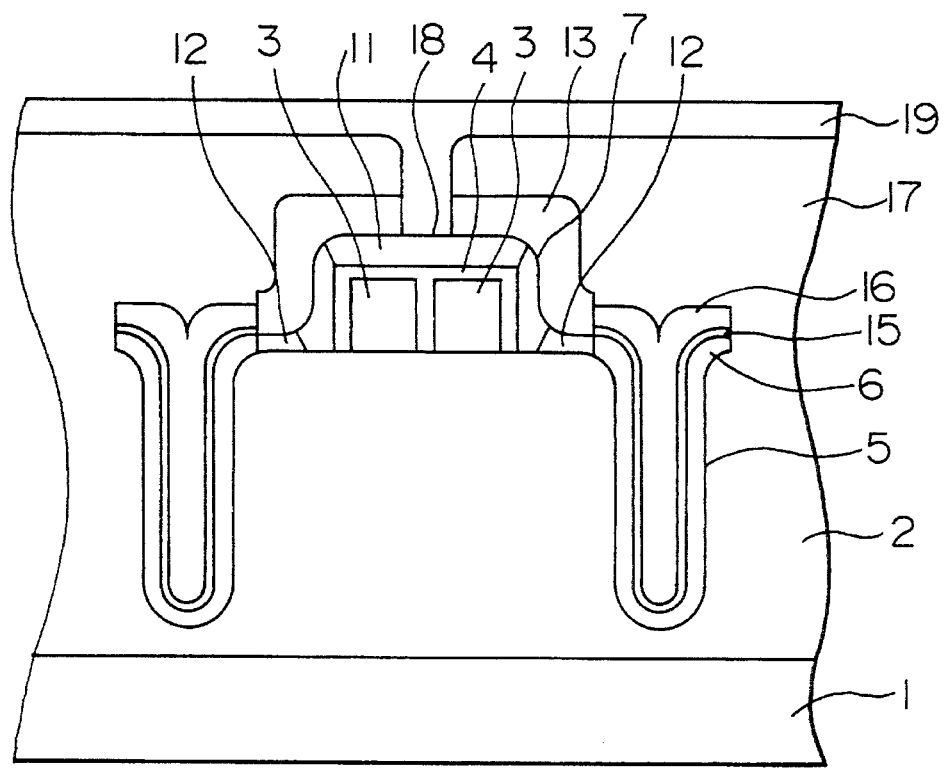
FIG. 8 is a sectional view showing a structure of a semiconductor device according to an embodiment of the present invention.

Next, a contact hole 18 is formed to reach the semiconductor region 11 and an aluminum film is formed on the whole surface of the insulating film 17 by a sputtering method for instance, and patterning is applied thereto by etching, thereby to form a metal interconnection 19 as shown in FIG. 8.

Thereafter, formation of a passivation film and so on are performed so as to complete a DRAM cell, as shown in FIG. 8, using a vertical transistor.

Figure 9:
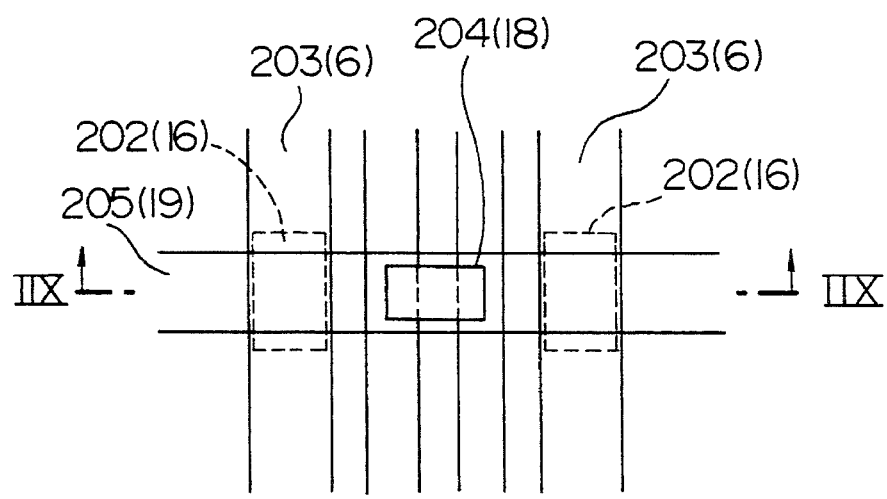
FIG. 9 is a diagram showing a layout of respective components of the semiconductor device shown in FIG. 8.
Figure 10:
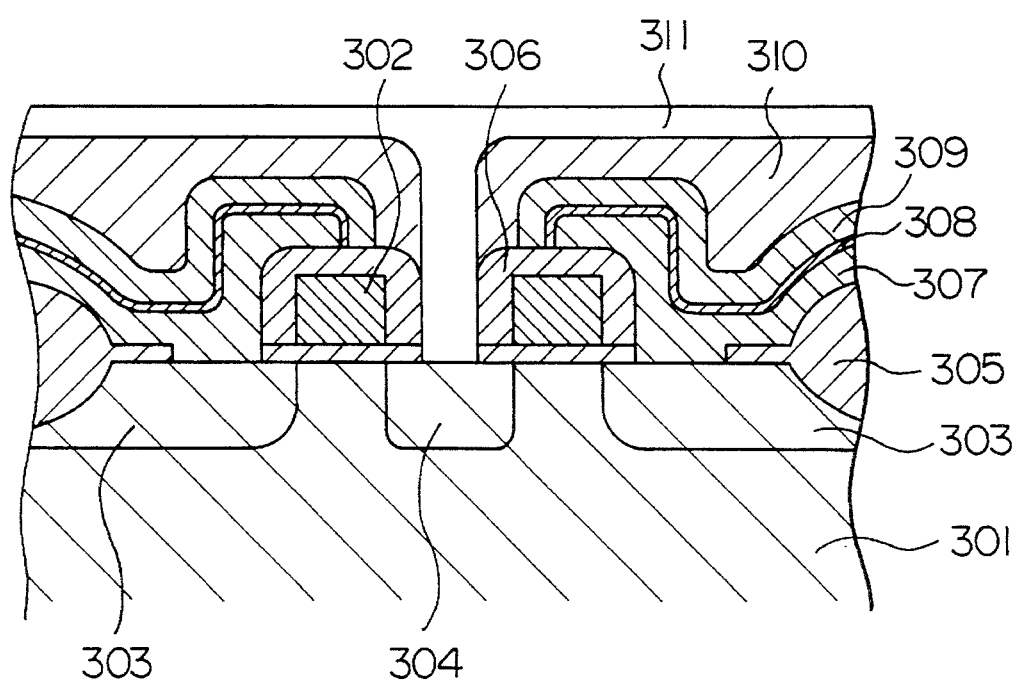
FIG. 10 is a sectional view showing a structure of a conventional semiconductor device.

FIG. 9 is a plan view of the DRAM formed as described above. A sectional view taken along a one-dot chain line IIX—IIX in FIG. 9 corresponds to FIG. 8, and gate electrodes (word lines) 201 in FIG. 9 correspond to the gates 3 in FIG. 8, storage nodes 202 in FIG. 9 correspond to polysilicon films 16 in FIG. 8, cell plates 203 correspond to polysilicon films 6 in FIG. 8, a contact 204 in FIG. 9 corresponds to a contact 18 in FIG. 8, and a metal interconnection (a bit line) 205 in FIG. 9 corresponds to the metal interconnection 19 in FIG. 8, respectively.

In a memory cell of a semiconductor device according to the present invention, a field insulator film for isolation is not required, and a transistor of the memory cell requires a smaller area due to a vertical SOI structure. In addition, a layer constituting a source or a drain and a layer constituting an electrode of the capacitor are formed integrally in one layer in a memory cell of the present invention in contrast with a conventional memory cell having a four-layer structure of a drain or source layer and three layers for forming a capacitor. Accordingly, the whole unit can be fabricated in a three-layer structure, thus simplifying a process of manufacturing.

We claim:

1. A semiconductor device comprising:

a semiconductor substrate;

an insulating film having a thickness formed on said semiconductor substrate;

a trench formed within said insulating film, said trench having a depth smaller than the thickness of said insulating film:

a capacitor formed in said trench;

a transistor including a gate electrode formed on said insulating film, a gate insulating film formed to cover said gate electrode and a semiconductor film formed on said gate insulating film, said semiconductor film including first conductivity type first and second regions spaced from each other and a second conductivity type third region disposed between said first and second regions, said first and second regions serving as a source and a drain of said transistor; and wherein an integral single layer is constituted by either one of said source or drain and a semiconductor layer of said capacitor.

2. A semiconductor device according to claim 1, wherein said semiconductor layer is a first semiconductor layer of said capacitor electrically and spatially connected to one of said source and drain, said capacitor further having an interlayer insulating layer and a second semiconductor layer.

3. A semiconductor device including at least one transistor and one capacitor, said semiconductor device comprising:

a semiconductor substrate;

a first insulating film having a thickness formed on said semiconductor substrate;

a gate electrode of said transistor formed on said insulating film;

a second insulating film formed to cover said gate electrode;

said one transistor including a semiconductor film formed on said second insulating film, said semiconductor film including a first conductivity type first and second regions spaced from each other and a second conductivity type third region disposed between said first and second regions;

a trench formed within said first insulating film having a depth that is smaller than the thickness of said first insulating film; and a capacitor formed in said trench, said capacitor having a first semiconductor layer, an interlayer insulating layer and a second semiconductor layer;

wherein said first region of said semiconductor film and said first semiconductor layer of said capacitor constitute an integral single layer.

4. A semiconductor device comprising:

a semiconductor substrate;

an insulating film having a thickness formed on said semiconductor substrate;

two transistors formed on said insulating film, each of said transistors including a gate electrode, a gate insulating film formed to cover said gate electrode and a semiconductor film formed on said date insulating film, said semiconductor film including first conductivity type first and second regions spaced from each other and a second conductivity type third region disposed between said first and second regions, said first and second serving as a drain and a source of said transistor;

two spaced trenches formed within said insulating film, each of said trenches having a depth that is smaller than the thickness of said insulating film; and a capacitor formed in each of said trenches;

wherein either one of said source or drain of each of said transistors and a semiconductor layer of said capacitor formed in one of said trenches constitute an integral single layer.

5. A semiconductor device according to claim 4, wherein said capacitor includes said semiconductor layer, an interlayer insulating layer and a second semiconductor layer.

6. A semiconductor device comprising:

a semiconductor substrate;

a first insulating film having a thickness formed on said semiconductor substrate;

first and second transistors formed on said first insulating film, each of said first and second transistors having a gate electrode a second insulating film formed to cover said gate electrode, a source and a drain formed on said second insulating film and a channel disposed between said source and a drain;

first and second trenches formed within said first insulating film and spaced from each other, each of said first and second trenches having a depth that is smaller than the thickness of said first insulating film; and first and second capacitors formed in said trenches, respectively, and disposed adjacent to said first and second transistors, respectively, each of said first and second capacitors being formed in a three-layer structure including two conductive layers and an interlayer insulating layer disposed between said two conductive layers;

wherein one of said two conductive layers of said first capacitor is integrally coupled to the source of said first transistor to form a single layer of continuous regions, and one of said two conductive layers of said second capacitor is integrally coupled to the source of said second transistor to form another single layer of continuous regions.

7. A semiconductor device comprising:

a semiconductor substrate;

an insulating film having a thickness;

a trench formed within said insulating film, said trench having a depth smaller than the thickness of said insulating film;

a capacitor formed in said trench;

a transistor including a gate electrode formed on said insulating film, a gate insulating film formed to cover said gate electrode and a semiconductor film formed on said gate insulating film, said semiconductor film including first conductivity type first and second regions spaced from each other and a second conductivity type third region disposed between said first and second regions, said first and second regions serving as a source and a drain of said transistor; and wherein either one of said source or drain and a semiconductor layer of said capacitor constitute an integral single layer.

8. A semiconductor device according to claim 7, wherein said capacitor includes said semiconductor layer, an interlayer insulating layer and a second semiconductor layer.

9. A semiconductor device including at least one transistor and one capacitor, said semiconductor device comprising:

a first insulating film having a thickness;

a gate electrode of said transistor formed on said first insulating film;

a second insulating film formed to cover said gate electrode;

said one transistor including a semiconductor film formed on said second insulating film, said semiconductor film including a first conductivity type first and second regions spaced from each other and a second conductivity type third region disposed between said first and second regions, a trench formed within said first insulating film, said trench having a depth that is smaller than the thickness of said first insulating film; and a capacitor formed in said trench and having a first semiconductor layer, an interlayer insulating layer and a second semiconductor layer;

wherein said first region of said semiconductor film and said first semiconductor layer of said capacitor constitute an integral single layer.

10. A semiconductor device comprising:

a semiconductor substrate;

an insulating film having a thickness;

two transistors formed on said insulating film, each of said transistors including a gate electrode, a gate insulating film foraged to cover said gate electrode and a semiconductor film formed on said gate insulating film, said semiconductor film including first conductivity type first and second regions spaced from each other and a second conductivity type third region disposed between said first and second regions, said first and second regions serving as a drain and a source of said transistor;

two spaced trenches formed within said insulating film, each of said trenches having a depth that is smaller than the thickness of said insulating film; and a capacitor formed in each of said trenches;

wherein one of said source and drain of each of said transistors and a semiconductor layer of said capacitor formed in one of said trenches constitute an integral single layer.

11. A semiconductor device according to claim 10, wherein each of said capacitors includes said semiconductor layer, an interlayer insulating layer and a second semiconductor layer.

12. A semiconductor device comprising:

a semiconductor substrate;

a first insulating film having a thickness formed on said semiconductor substrate;

first and second transistors formed on said insulating film, each of said first and second transistors having a gate electrode, a second insulating film formed to cover said gate electrode, a source and a drain formed on said second insulating film and a channel disposed between said source and drain;

first and second trenches formed within said first insulating film and spaced from each other, each of said trenches having a depth that is smaller than the thickness of said first insulating film; and first and second capacitors formed in said trenches, respectively, and disposed adjacent to said first and second transistors, respectively, each of said first and second capacitors being formed in a three-layer structure including two conductive layers and an interlayer insulating layer disposed between said two conductive layers;

wherein one of said two conductive layers of said first capacitor is integrally coupled to the source of said first transistor to form a single layer of continuous regions, and one of said two conductive layers of said second capacitor is integrally coupled to the source of said second transistor to form another single layer of continuous regions.

* * * * *